(12) United States Patent
Honda et al.

(10) Patent No.: US 10,734,350 B2
(45) Date of Patent: Aug. 4, 2020

(54) METHOD FOR MANUFACTURING SEMICONDUCTOR DEVICE

(71) Applicant: HITACHI CHEMICAL COMPANY, LTD., Tokyo (JP)

(72) Inventors: Kazutaka Honda, Tokyo (JP); Koichi Chabana, Tokyo (JP); Makoto Satou, Tokyo (JP); Akira Nagai, Tokyo (JP)

(73) Assignee: HITACHI CHEMICAL COMPANY, LTD., Tokyo (JP)

( * ) Notice: Subject to any disclaimer, the term of this patent is extended or adjusted under 35 U.S.C. 154(b) by 0 days.

(21) Appl. No.: 16/099,753

(22) PCT Filed: Apr. 10, 2017

(86) PCT No.: PCT/JP2017/014680
§ 371 (c)(1),
(2) Date: Nov. 8, 2018

(87) PCT Pub. No.: WO2017/195517
PCT Pub. Date: Nov. 16, 2017

(65) Prior Publication Data
US 2019/0123014 A1 Apr. 25, 2019

(30) Foreign Application Priority Data

May 9, 2016 (JP) .................. 2016-093809
Jun. 9, 2016 (JP) .................. 2016-115355

(51) Int. Cl.
*H01L 23/00* (2006.01)
*C09J 163/00* (2006.01)
(Continued)

(52) U.S. Cl.
CPC ............... *H01L 24/81* (2013.01); *C09J 7/30* (2018.01); *C09J 11/06* (2013.01); *C09J 163/00* (2013.01);
(Continued)

(58) Field of Classification Search
CPC .. H01L 25/0655; H01L 25/0657; H01L 25/50
See application file for complete search history.

(56) References Cited

U.S. PATENT DOCUMENTS

| 2003/0159773 A1 | 8/2003 | Tomiyama et al. |
| 2006/0292823 A1 | 12/2006 | Ramanathan et al. |

(Continued)

FOREIGN PATENT DOCUMENTS

| JP | H2-280349 A | 11/1990 |
| JP | H03-171643 A | 7/1991 |

(Continued)

*Primary Examiner* — Seahvosh Nikmanesh
(74) *Attorney, Agent, or Firm* — Fitch, Even, Tabin & Flannery, LLP

(57) ABSTRACT

There is disclosed a method for manufacturing a semiconductor device comprising a semiconductor chip having a connection portion and a wiring circuit board having a connection portion, the respective connection portions being electrically connected to each other, or a semiconductor device comprising a plurality of semiconductor chips having connection portions, the respective connection portions being electrically connected to each other. The connection portions consist of metal. The above described method comprises: (a) a first step of press-bonding the semiconductor chip and the wiring circuit board or the semiconductor chips to each other so that the respective connection portions are in contact with each other with a semiconductor adhesive interposed therebetween, at a temperature lower than a melting point of the metal of the connection portion, to obtain a temporarily connected body; (b) a second step of sealing at least a part of the temporarily connected body with a sealing resin to obtain a sealed temporarily connected body; and (c) a third step of heating the sealed temporarily connected body at a temperature equal to or higher than the melting point of the metal of the connection portion, to obtain a sealed connected body.

18 Claims, 6 Drawing Sheets

(51) Int. Cl.
- *C09J 201/00* (2006.01)
- *C09J 11/06* (2006.01)
- *H01L 21/56* (2006.01)
- *C09J 7/30* (2018.01)
- *H01L 23/31* (2006.01)
- *H01L 25/065* (2006.01)
- *H01L 25/00* (2006.01)

(52) U.S. Cl.
CPC ............ *C09J 201/00* (2013.01); *H01L 21/56* (2013.01); *H01L 24/73* (2013.01); *H01L 23/3121* (2013.01); *H01L 25/0655* (2013.01); *H01L 25/0657* (2013.01); *H01L 25/50* (2013.01); *H01L 2224/05644* (2013.01); *H01L 2224/13082* (2013.01); *H01L 2224/13111* (2013.01); *H01L 2224/13139* (2013.01); *H01L 2224/13144* (2013.01); *H01L 2224/13147* (2013.01); *H01L 2224/13155* (2013.01); *H01L 2224/73204* (2013.01); *H01L 2224/81* (2013.01); *H01L 2224/81203* (2013.01); *H01L 2225/06513* (2013.01); *H01L 2924/3511* (2013.01)

(56) References Cited

U.S. PATENT DOCUMENTS

| | | |
|---|---|---|
| 2014/0312511 A1 | 10/2014 | Nakamura et al. |
| 2018/0096980 A1 | 4/2018 | Asahi et al. |
| 2018/0312731 A1* | 11/2018 | Honda ............... H01L 25/0657 |

FOREIGN PATENT DOCUMENTS

| | | |
|---|---|---|
| JP | 2002-016104 A | 1/2002 |
| JP | 2004-194290 A | 7/2004 |
| JP | 2008-294382 A | 4/2008 |
| JP | 2008-109009 A | 5/2008 |
| JP | 2013-173834 A | 9/2013 |
| JP | 2013-187491 A | 9/2013 |
| JP | 2014-143316 A | 8/2014 |
| TW | 201211195 A | 3/2012 |
| WO | 2013/133015 A1 | 9/2013 |

* cited by examiner (a)

(b)

(a)

(b)

(a)

(b)

METHOD FOR MANUFACTURING SEMICONDUCTOR DEVICE

CROSS-REFERENCE TO RELATED APPLICATIONS

This application is a U.S. national phase application filed under 35 U.S.C. § 371 of International Application No. PCT/JP2017/014680, filed Apr. 10, 2017, designating the United States, which claims priority from Japanese Patent Application No. 2016-093809, filed May 9, 2016, and Japanese Patent Application No. 2016-115355, filed Jun. 9, 2016, which are hereby incorporated herein by reference in their entirety.

TECHNICAL FIELD

The present invention relates to a method for manufacturing a semiconductor device.

BACKGROUND ART

Heretofore, in order to connect a semiconductor chip with a substrate, a wire bonding method using a thin metal wire such as a gold wire has been widely applied. However, in order to meet the requirements of a high function, high integration, a high speed and the like for semiconductor devices, a flip-chip connection method (FC connection method) is getting widespread which forms an electro-conductive protrusion called a bump on a semiconductor chip or a substrate, and directly connects the semiconductor chip with the substrate.

As for the FC connection method, a method of metal bonding using solder, tin, gold, silver, copper or the like, a method of metal bonding by applying ultrasonic vibration, a method of retaining mechanical contact by a shrinking force of the resin are known, but from the viewpoint of the reliability of the connection portion, the method of metal bonding using solder, tin, gold, silver, copper or the like is common.

For example, in the connection between the semiconductor chip and the substrate, a COB (Chip On Board) type connection method is also an FC connection method, which is actively used for BGA (Ball Grid Array), CSP (Chip Size Package) and the like.

The FC connection method is widely used also in a COC (Chip On Chip) type connection method of forming a bump or wiring on a semiconductor chip and connecting the semiconductor chips to each other.

CITATION LIST

Patent Literature

Patent Literature 1: Japanese Unexamined Patent Publication No. 2008-294382

SUMMARY OF INVENTION

Technical Problem

In a package to which further miniaturization, thinning and high functions are strongly required, a chip stack type package including chips layered and multi-staged by the above described connection method, a POP (package on package), a TSV (through silicon via) and the like are also beginning to widely spread.

The above described technology is frequently used because of being capable of arranging in a three-dimensional manner instead of in a planar manner and thereby downsizing the package, is effective at improving a performance of the semiconductor, decreasing noise, reducing a mounting area and saving electric power, and has received attention as a semiconductor wiring technology of next generation.

From the viewpoint of the improvement of the productivity, COW (Chip On Wafer) of press-bonding (connecting) a semiconductor chip on a wafer and then dividing it into individual pieces to manufacture a semiconductor package, Wow (Wafer On Wafer) of press-bonding (connecting) wafers to each other and then dividing it into individual pieces to manufacture a semiconductor package also have received attention.

When the flip chip package described above is assembled, firstly, a semiconductor chip or a semiconductor chip onto which a semiconductor adhesive is supplied is picked up from a diced wafer with a collet, and is supplied to a press-bonding tool through the collet.

Next, the chip-chip or chip-substrate is aligned, and is press-bonded.

In order that a metallic bond is formed, the temperature of the press-bonding tool is increased so that the metals of upper and lower connection portions or metals of one or more of the upper and lower connection portions reach a melting point.

In the chip stack package involving layering and multi-staging chips, chip pickup, alignment and press-bonding are repeated.

After that, in order to protect the semiconductor package, the upper surface of the chip is sealed with a sealing resin, and a sealed body is formed.

However, when the conventional flip chip package is assembled, warpage may occur in the semiconductor package after press-bonding, due to a difference in coefficients of thermal expansion between the chip and the sealing material for semiconductor, or between the chip and the substrate. Due to this warpage, there arises a problem that overmolding cannot be performed and a connection failure occurs in the package.

The present invention has been made in view of the above described circumstances, and is directed to providing a method for manufacturing a semiconductor device with which the warpage at the time when semiconductor members are connected to each other can be suppressed.

Solution to Problem

The present invention provides a method for manufacturing a semiconductor device, which is a method for solving the above described problems and can suppress a warpage of the semiconductor device.

(1) A method for manufacturing a semiconductor device comprising a semiconductor chip having a connection portion and a wiring circuit board having a connection portion, the respective connection portions being electrically connected to each other, or a semiconductor device comprising a plurality of semiconductor chips having connection portions, the respective connection portions being electrically connected to each other, wherein the connection portions consist of metal, the method comprising:

(a) a first step of press-bonding the semiconductor chip and the wiring circuit board or the semiconductor chips to each other so that the respective connection portions are in contact with each other with a semiconductor adhesive interposed therebetween, at a temperature lower than a melting point of the metal of the connection portion, to obtain a temporarily connected body;

(b) a second step of sealing at least a part of the temporarily connected body with a sealing resin to obtain a sealed temporarily connected body; and (c) a third step of heating the sealed temporarily connected body at a temperature equal to or higher than the melting point of the metal of the connection portion, to obtain a sealed connected body.

(2) A method for manufacturing a semiconductor device comprising a semiconductor chip having a connection portion and a wiring circuit board having a connection portion, the respective connection portions being electrically connected to each other through a connecting bump, or a semiconductor device comprising a plurality of semiconductor chips having connection portions, the respective connection portions being electrically connected to each other through a connecting bump, wherein the connection portions and the connecting bump consist of metal, the method comprising:

(a) a first step of press-bonding the semiconductor chip and the wiring circuit board or the semiconductor chips to each other so that the respective connection portions are in contact with the connecting bump with a semiconductor adhesive interposed therebetween, at a temperature lower than a melting point of the metal of the connecting bump, to obtain a temporarily connected body;

(b) a second step of sealing at least a part of the temporarily connected body with a sealing resin to obtain a sealed temporarily connected body; and (c) a third step of heating the sealed temporarily connected body at a temperature equal to or higher than the melting point of the metal of the connecting bump, to obtain a sealed connected body.

(3) The method for manufacturing a semiconductor device, wherein the first step comprises sandwiching the semiconductor chip and the wiring circuit board or the semiconductor chips with a pair of facing pressing members for temporary press-bonding, and heating and pressurizing, to thereby press-bond the semiconductor chip and the wiring circuit board or the semiconductor chips to each other.

(4) The method for manufacturing a semiconductor device, wherein the semiconductor adhesive contains a compound having a weight average molecular weight of 10000 or less and a curing agent, and a melt viscosity at 80 to 130° C. is 6000 Pa·s or less.

(5) The method for manufacturing a semiconductor device, wherein the semiconductor adhesive contains a compound having a weight average molecular weight of 10000 or less, a curing agent, and a silanol compound represented by the following general formula (1):

[Chemical Formula 1]

$$R^1-R^2-Si(OH)_3 \qquad (1)$$

wherein $R^1$ represents an alkyl group or a phenyl group, and $R^2$ represents an alkylene group.

(6) The method for manufacturing a semiconductor device, wherein $R^1$ is a phenyl group.

(7) The method for manufacturing a semiconductor device, wherein the silanol compound is solid at 25° C.

(8) The method for manufacturing a semiconductor device, wherein the semiconductor adhesive contains a high molecular weight component having a weight average molecular weight of more than 10000.

(9) The method for manufacturing a semiconductor device, wherein the high molecular weight component is a component having a weight average molecular weight of 30000 or more and a glass transition temperature of 100° C. or lower.

(10) The method for manufacturing a semiconductor device, wherein the semiconductor adhesive is in a film form.

Advantageous Effects of Invention

According to the present invention, a method for manufacturing a semiconductor device can be provided with which a warpage at the time when the semiconductor members are connected to each other can suppressed. Specifically, as described above, a semiconductor chip is sealed with a resin to form a sealed body before the step of subjecting the semiconductor chip to heating treatment at a temperature higher than a melting point of metal of a connection portion and the like to form a metallic bond, and thereby the warpage of a package can be suppressed.

DESCRIPTION OF EMBODIMENTS

Chips, substrates and the like will be described below which will be used in the method for manufacturing a semiconductor device according to the present embodiment.

<Semiconductor Device>

Figure 1:
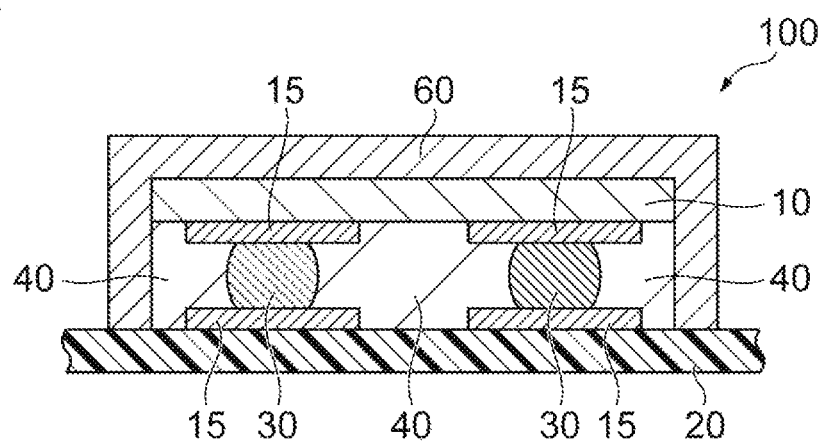
FIG. 1 is a schematic cross-sectional view showing one embodiment of a semiconductor device.
Figure 1:
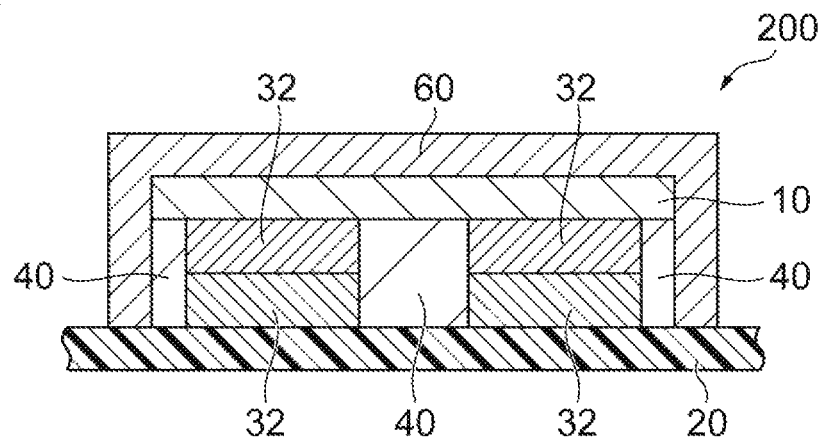

A semiconductor device that is obtained by the method for manufacturing a semiconductor device according to the present embodiment will be described below with reference to FIG. 1 and FIG. 2. FIG. 1 shows a cross-sectional structure of a case where a semiconductor chip is connected with a substrate; and FIG. 2 shows a cross-sectional structure of a case where the semiconductor chips are connected with each other.

FIG. 1 is a schematic cross-sectional view showing one embodiment of the semiconductor device. A semiconductor device 100 shown in FIG. 1(a) includes: a semiconductor chip 10 and a substrate (circuit wiring board) 20 that face each other; wires 15 that are arranged on mutually facing surfaces of the semiconductor chip 10 and the substrate 20, respectively; a connecting bump 30 that connects the wires 15 of the semiconductor chip 10 and the substrate 20 to each other; an adhesive layer 40 that fills a gap between the semiconductor chip 10 and the substrate 20 without forming a vacancy; and a sealing resin 60, which seals a connection portion between the semiconductor chip 10 and the substrate 20. The semiconductor chip 10 and the substrate 20 are flip-chip connected by the wires 15 and the connecting bump 30. The wires 15 and the connecting bump 30 are sealed by the adhesive layer 40, and are isolated from an external environment. Similarly, the semiconductor chip 10 and the adhesive layer 40 are sealed by the sealing resin 60, and are isolated from the external environment.

A semiconductor device 200 shown in FIG. 1(b) includes: a semiconductor chip 10 and a substrate 20 that face each other; bumps 32 that are arranged on mutually facing surfaces of the semiconductor chip 10 and the substrate 20, respectively; and an adhesive layer 40 that fills a gap between the semiconductor chip 10 and the substrate 20 without forming a vacancy. The semiconductor chip 10 and the substrate 20 are flip-chip connected by the facing bumps 32 being mutually connected. The bumps 32 are sealed by the adhesive layer 40, and are isolated from the external environment. Similarly, the semiconductor chip 10 and the adhesive layer 40 are sealed by the sealing resin 60, and are isolated from the external environment. The adhesive layer 40 is a cured product of the semiconductor adhesive.

Figure 2:
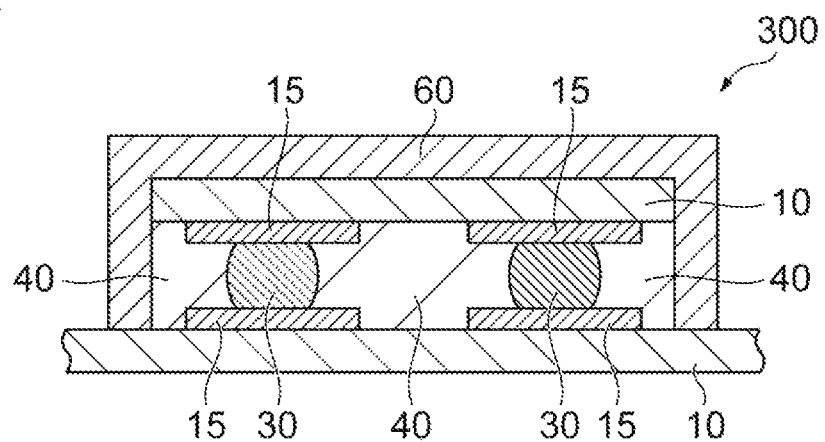
FIG. 2 is a schematic cross-sectional view showing one embodiment of a semiconductor device.
Figure 2:
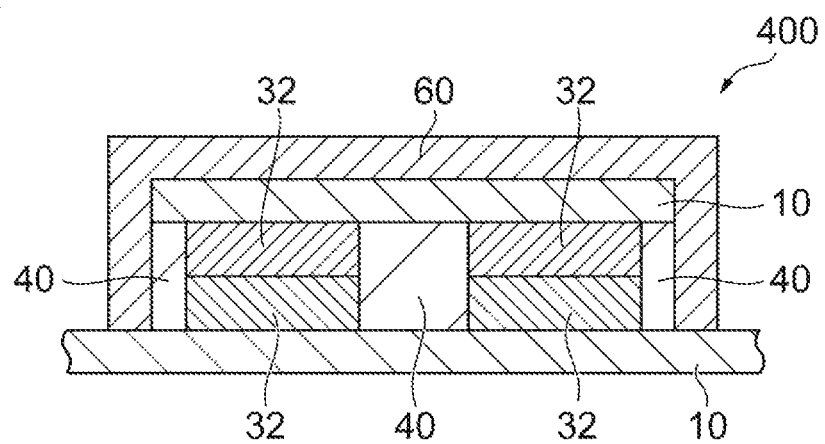

FIG. 2 is a schematic cross-sectional view showing another embodiment of the semiconductor device. A semiconductor device 300 shown in FIG. 2(a) is similar to the semiconductor device 100, except that two semiconductor chips 10 are flip-chip connected by the wires 15 and the connecting bump 30. The semiconductor device 400 shown in FIG. 2(b) is similar to the semiconductor device 200, except that two semiconductor chips 10 are flip-chip connected by the bumps 32. Examples of a more specific embodiment of that in FIG. 2(a) include an embodiment in which the semiconductor chip 10 on the upper side in the figure has a copper pillar and a solder (solder bump) as a connection portion, and the semiconductor chip 10 on the lower side in the figure has a pad (gold plated on connection portion) as the connection portion.

As for materials of an electro-conductive protrusion referred to as the bump (connecting bump), gold, silver, copper, solder (where main components are, for example, tin-silver, tin-lead, tin-bismuth, tin-copper, tin-silver-copper and the like), tin, nickel, and the like are used as main components, and the materials may be each composed of only a single component or may be each composed of a plurality of components. In addition, the materials may be each formed so as to form such a structure that the above metals are stacked. The bump may be formed on the semiconductor chip or the substrate. The metal of the connection portion may contain relatively inexpensive copper, or a solder. The metal of the connection portion may contain the solder, from the viewpoints of an improvement of connection reliability and a suppression of warpage.

For the metal surface of the connection portion referred to as a pad, gold, silver, copper, solder (where main components are, for example, tin-silver, tin-lead, tin-bismuth, tin-copper, tin-silver-copper and the like), tin, nickel and the like are used as a main component, and the component may be composed of only a single component or may be composed of a plurality of components. In addition, the material may be formed so as to form such a structure that the above metals are stacked. The pad may contain gold or a solder, from the viewpoint of connection reliability.

On the surface of a wire (wiring pattern), a metal layer may be formed which consists of gold, silver, copper, solder (where main components are tin-silver, tin-lead, tin-bismuth, tin-copper, tin-silver-copper and the like), tin, nickel and the like as a main component, and the metal layer may be composed of only a single component or may be composed of a plurality of components. In addition, the metal layer may have such a structure that a plurality of metal layers are stacked. The metal of the connection portion may contain relatively inexpensive copper, or a solder. The metal of the connection portion may contain the solder, from the viewpoints of the improvement of connection reliability and the suppression of warpage.

For the semiconductor device, for example, connection is made between the bump and the bump, between the bump and the pad, or between the bump and the wiring, as described above. In this case, in the heating treatment (third step) which will be described later, the metal of either one of the connection portions may become equal to or higher than the melting point.

The semiconductor chip 10 is not limited in particular, and various semiconductors can be used which include element semiconductors such as silicon and germanium, and compound semiconductors such as gallium arsenide and indium phosphide.

The substrate 20 (semiconductor substrate) is not limited in particular, as long as the substrate is an ordinary circuit board. Circuit boards can be used as the substrate 20, which include: a circuit board having a wire 15 (wiring pattern) that has been formed by removing an unnecessary portion of the metal film by etching, on an insulating substrate containing glass epoxy, polyimide, polyester, ceramic, epoxy resin, bismaleimide triazine or the like as a main component; a circuit board having a wire 15 that has been formed by metal plating or the like, on the surface of the above described insulating substrate; and a circuit board having a wire 15 that has been formed by printing an electro-conductive substance on the surface of the above described insulating substrate.

A plurality of structures (packages) as shown in the semiconductor devices 100 to 400 may be stacked. In this case, the semiconductor devices 100 to 400 may be electrically connected to each other by a bump or a wire which contains gold, silver, copper, solder (where main components are, for example, tin-silver, tin-lead, tin-bismuth, tin-copper and tin-silver-copper), tin, nickel or the like.

Figure 3:
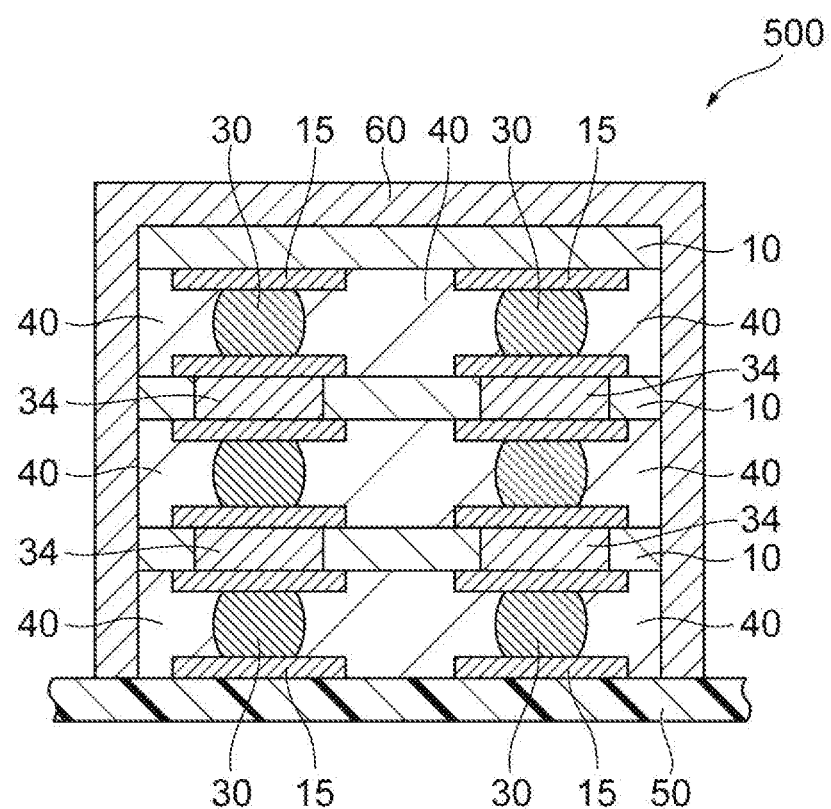
FIG. 3 is a schematic cross-sectional view showing one embodiment of a semiconductor device.

Examples of techniques for stacking a plurality of semiconductor devices include a TSV (Through-Silicon Via) technology, as is shown in FIG. 3. In the TSV technology, semiconductor chips are flip-chip connected or stacked through a semiconductor adhesive placed between the semiconductor chips. FIG. 3 is a schematic cross-sectional view showing another embodiment of the semiconductor device, and is a semiconductor device using the TSV technology. In the semiconductor device 500 shown in FIG. 3, the wire 15 formed on an interposer 50 is connected to the wire 15 of the semiconductor chip 10 through the connecting bump 30, and thereby the semiconductor chip 10 and the interposer 50 are flip-chip connected. The gap between the semiconductor chip 10 and the interposer 50 is filled with the adhesive layer 40 without forming a vacancy. On the surfaces on the side opposite to the interposer 50 in the above described semiconductor chips 10, the semiconductor chips 10 are repeatedly stacked through the wire 15, the connecting bump 30 and the adhesive layer 40. The wires 15 of the patterned faces on the front and back surfaces of the semiconductor chip 10 (excluding outermost layer) are connected with each other by a through electrode 34 which is filled in a hole penetrating the inside of the semiconductor chip 10. Copper, aluminum or the like can be used for the material of the through electrode 34. A stacked body comprising the plurality of semiconductor chips 10 is sealed by the sealing resin 60, and is isolated from the external environment.

Due to such a TSV technology, it becomes possible to acquire a signal also from the rear face of the semiconductor chip, which is not usually used. Furthermore, because the through electrode 34 vertically passes through the inside of the semiconductor chip 10, it is possible to shorten a distance between the facing semiconductor chips 10 and a distance between the semiconductor chip 10 and the interposer 50, and flexible connection is possible. The method for manufacturing a semiconductor device according to the present embodiment can also be applied between the stacked chips and the interposer, in such a TSV technology.

Figure 4:
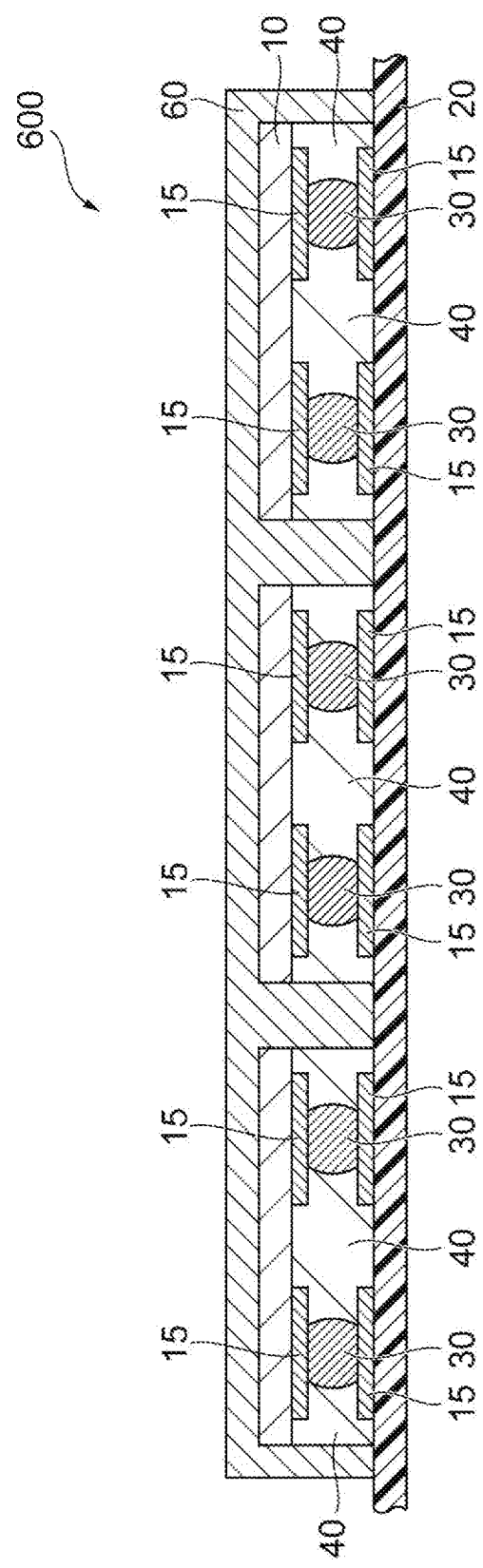
FIG. 4 is a schematic cross-sectional view showing one embodiment of a semiconductor device.
Figure 5:
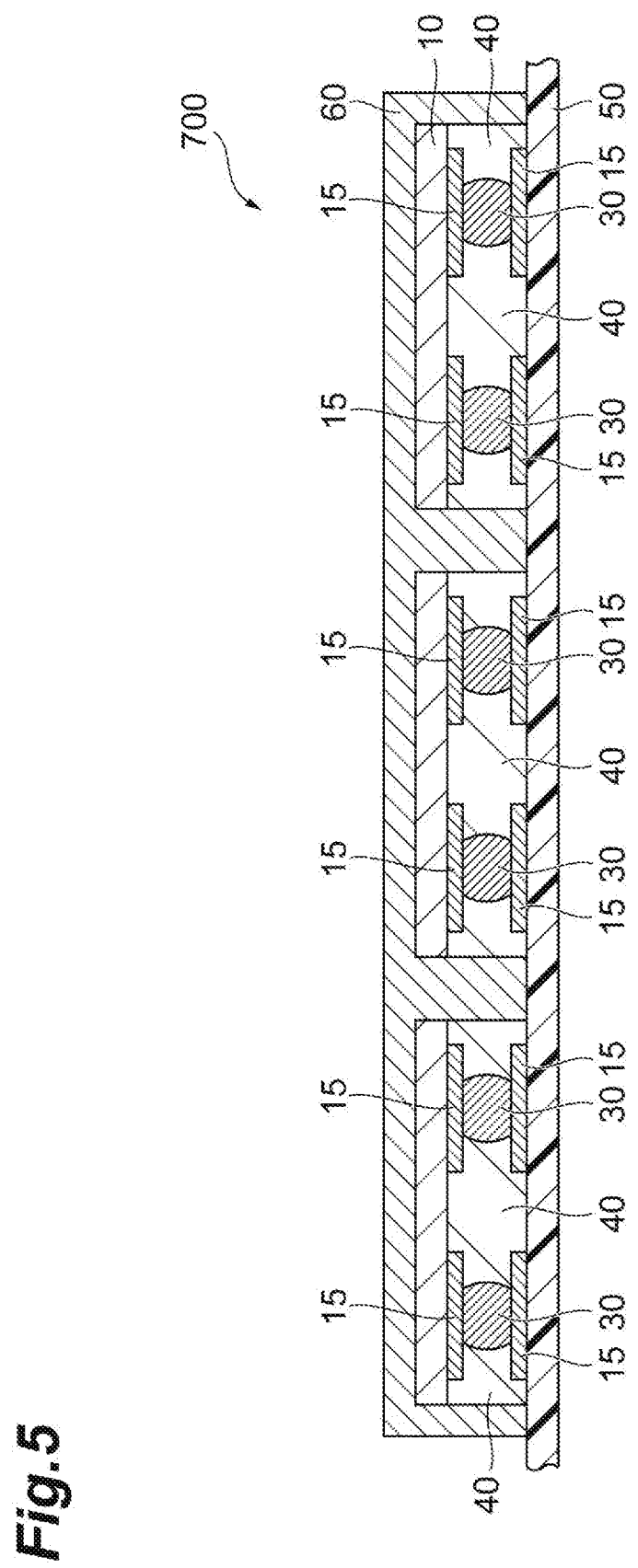
FIG. 5 is a schematic cross-sectional view showing one embodiment of a semiconductor device.

FIGS. 4 and 5 are schematic cross-sectional views showing other embodiments of the semiconductor device. A semiconductor device 600 shown in FIG. 4 is similar to the semiconductor device 100, except that a plurality of semiconductor chips 10 are flip-chip connected to the substrate 20 by the wires 15 and the connecting bumps 30. A semiconductor device 700 shown in FIG. 5 is similar to the semiconductor device 100, except that a plurality of semiconductor chips 10 are flip-chip connected to the interposer 50 by the wires 15 and the connecting bumps 30.

<Method for Manufacturing Semiconductor Device>

A method for manufacturing a semiconductor device according to the first embodiment is a method for manufacturing a semiconductor comprising a semiconductor chip having a connection portion and a wiring circuit board having a connection portion, the respective connection portions being electrically connected to each other through a connecting bump, or a semiconductor device comprising a plurality of semiconductor chips having connection portions, the respective connection portions being electrically connected to each other through a connecting bump, wherein the connecting bump consists of metal, the method comprising:

(a) a first step of press-bonding the semiconductor chip and the wiring circuit board or the semiconductor chips to each other so that the respective connection portions are in contact with the connecting bump with a semiconductor adhesive interposed therebetween, at a temperature lower than a melting point of a metal of the connecting bump, to obtain a temporarily connected body;

(b) a second step of sealing at least a part of the temporarily connected body with a sealing resin to obtain a sealed temporarily connected body; and (c) a third step of heating the sealed temporarily connected body at a temperature equal to or higher than the melting point of the metal of the connecting bump, to obtain a sealed connected body.

Thereby, the semiconductor device shown in FIG. 1(a) or FIG. 2(a), for example, can be obtained. Hereinafter, each step will be described by taking FIG. 2(a) as an example.

First, a semiconductor adhesive in a film form (hereinafter also referred to as "film-form adhesive") is stuck onto the semiconductor chip 10. The film-form adhesive can be stuck by heat pressing, roll laminating, vacuum laminating or the like. The supply area and the thickness of the film-form adhesive are appropriately set according to sizes of the semiconductor chip 10 and the substrate 20, a height of the connecting bump 30, and the like. It is acceptable to stick the film-form adhesive to the semiconductor chip 10; or is also acceptable to stick the film-form adhesive to a semiconductor wafer, then dice the semiconductor wafer into divided semiconductor chips 10, and thereby prepare the semiconductor chip 10 to which the film-form adhesive is stuck.

A temporarily connected body is obtained by aligning wires 15 of the semiconductor chips 10 with each other by using a connection device such as a flip-chip bonder, and then temporary press-bonding the semiconductor chips at a temperature equal to or lower than the melting point of the connecting bumps 30 (solder bumps) (first step).

Next, a sealed temporarily connected body is obtained by sealing the upper surface of one semiconductor chip 10 in the temporarily connected body (second step). The semiconductor chip 10 can be sealed by a compression molding machine, a transfer molding machine or the like.

After that, a sealed connected body is obtained by heating the sealed temporarily connected body so that a temperature equal to or higher than the melting point of the connecting bump 30 is applied, and forming a metallic bond between the wire 15 and the connecting bump 30 (third step). The heating treatment can be performed by a thermocompression bonding machine, a reflow furnace, a pressure oven or the like.

Figure 6:
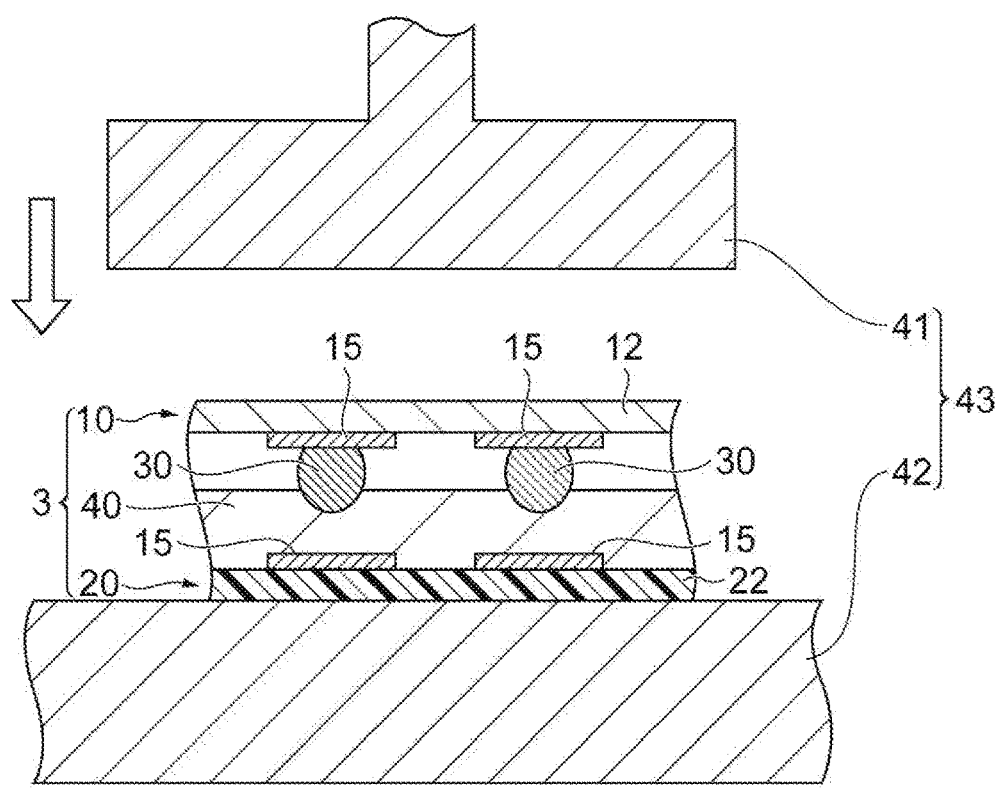
FIG. 6 is a process chart showing one example of a step of temporary press-bonding a substrate to a semiconductor chip.
Figure 6:
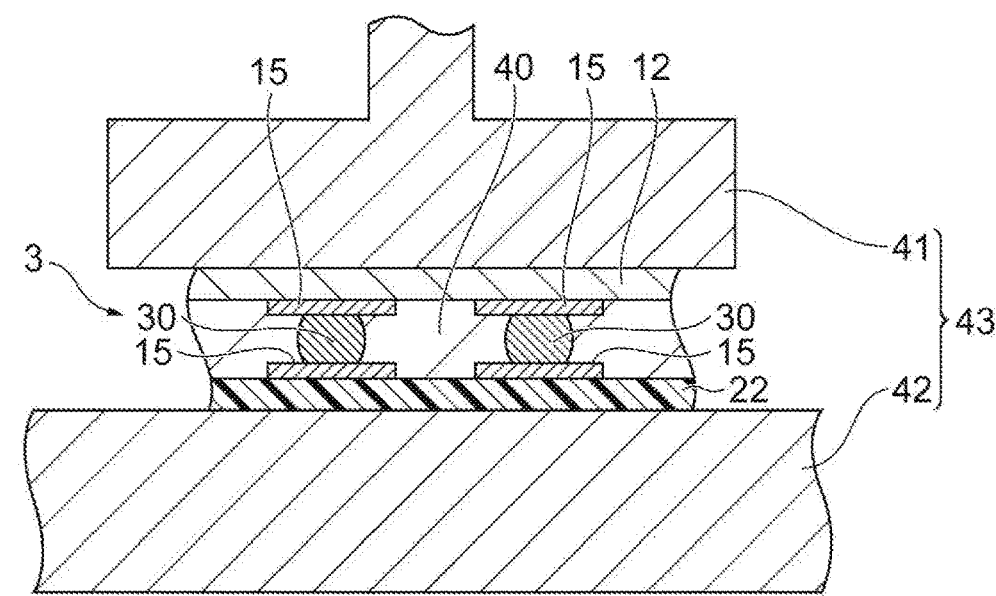

One example of the first step will be described. FIG. 6 is a process chart showing one example of steps of temporarily press-bonding a substrate to a semiconductor chip.

Firstly, as shown in FIG. 1(a), a stacked body 3 is formed by overlapping a semiconductor chip 10 having a semiconductor chip body 12, a wire 15 and a connecting bump 30 on a substrate 20 having a substrate body 22 and a wire 15 as a connection portion, while arranging an adhesive layer 40 therebetween. The semiconductor chip 10 is formed by dicing of a semiconductor wafer, then is picked up and transported onto the substrate 20, and is aligned so that the connecting bump 30 and a wire 15 of the substrate 20 are arranged to face each other. The stacked body 3 is formed on a stage 42 of a pressing apparatus 43 having a press-bonding head 41 and the stage 42 which are arranged so as to face each other and work as a pair of pressing members for temporary press-bonding. The connecting bump 30 is provided on the wire 15 which has been provided on the semiconductor chip body 12. The wire 15 of the substrate 20 is provided at a predetermined position on the substrate body 22. The connecting bump 30 and the wire 15 have each a surface formed of a metal material.

Subsequently, as shown in FIG. 1(b), the stacked body 3 is sandwiched between the stage 42 and the press-bonding head 41 which work as the pressing members for the temporary press-bonding, and is heated and pressurized; and thereby the substrate 20 is temporarily press-bonded to the semiconductor chip 10. In the case of the embodiment of FIG. 6, the press-bonding head 41 is arranged on the semiconductor chip 10 side of the stacked body 3, and the stage 42 is arranged on the substrate 20 side of the stacked body 3.

When at least one of the stage 42 and the press-bonding head 41 heats and pressurizes the stacked body 3 for the temporary press-bonding, the stacked body 3 may be heated to a temperature lower than a melting point of a metal material that forms the surface of the connecting bump 30 of the semiconductor chip 10, and a melting point of a metal material that forms the surface of the wire 15 which works as the connection portion of the substrate 20.

It is preferable that a temperature (temperature of pressing member) at the time when a press-bonding tool (pressing member for temporary press-bonding) picks up the semiconductor chip 10 (provided with film-form adhesive), at the time of the temporary press-bonding in the first step, is low temperature so that heat of the press-bonding tool is not transferred to a collet, the semiconductor chip 10 and the like. Meanwhile, the temperature (temperature of pressing member) at the time of the temporary press-bonding may be a high temperature so as to enhance the flowability of the film-form adhesive and eliminate voids formed at the time of entanglement, but it is preferable that the temperature is lower than a reaction start temperature of the film-form adhesive. In addition, a difference between the temperature at the time when the press-bonding tool picks up the semiconductor chip 10 and the temperature at the temporary press-bonding may be small, so as to shorten the cooling time. The difference may be 100° C. or lower, or 60° C. or lower. The temperatures at the time of picking up and temporary press-bonding may be constant. When the difference between both of the operations is 100° C. or lower, there is a tendency that the cooling time of the press-bonding tool is shortened, and the productivity further improves. Incidentally, the reaction start temperature means an on-set temperature at the time when the temperature is measured with the use of DSC (made by Perkin-Elmer Corp., DSC-Pyirs 1) on conditions that the amount of a sample is 10 mg, a rate of temperature increase is 10° C./min, and the measurement atmosphere is air or nitrogen atmosphere.

From the above described viewpoint, the temperature of the stage 42 and/or the press-bonding head 41 may be, for example, 30° C. or higher and 130° C. or lower, while the semiconductor chip is picked up, and may be, for example, 50° C. or higher and 150° C. or lower, while the stacked body 3 is heated and pressurized for the temporary press-bonding.

The connection load in the first step depends on the number of bumps, but is set in consideration of the absorption of height variation of the bumps, the control of a deformation amount of the bump, and the like. The load may be increased so that the voids are eliminated, and the metals of the connection portions of the semiconductor chip 10, or of the semiconductor chip 10 and the substrate 20 are in contact with the connecting bump, at the time of the press-bonding. When the load is large, it is easy to eliminate the voids, and it is easy that the metals of the connection portion and the connecting bump are in contact with each other. For example, the load may be 0.009 N to 0.2 N per 1 pin (1 bump) of the semiconductor chip 10.

The press-bonding time to be spent for the temporary press-bonding may be set at a short time, from the viewpoint of the improvement of the productivity. The press-bonding time for the short time means that the time period (for example, period of time while solder is used) is 5 seconds or shorter, during which the connection portion is heated to 230° C. or higher while connection is formed. The connection time may be 4 seconds or shorter, or 3 seconds or shorter. In addition, if each press-bonding time is shorter than the cooling time, a greater effect of the manufacturing method of the present invention can appear.

In the second step, a temporarily connected body (semiconductor package) after the first step is carried into a mold for forming a sealed temporarily connected body, and the sealing resin 60 is supplied onto the temporarily connected body. After that, the sealing resin 60 is spread and cured to form a sealed temporarily connected body.

For the heating treatment in the third step, a temperature is necessary which is equal to or higher than a melting point of a metal of the connecting bump 30 in the sealed temporarily connected body. For example, if the connecting bump 30 is a solder bump, the temperature may be 230° C. or higher and 330° C. or lower. If the temperature is low, there is a tendency that the metal of the connecting bump 30 is not melted, and a sufficient metallic bond is not formed.

It is acceptable to set the connection time in the third step at a short time, from the viewpoint of the improvement of the productivity, and it is also acceptable to set the connection time at a time period of such a level as to be capable of melting the connecting bumps 30 (solder bumps), eliminating the oxide film and impurities on the surface, and forming the metallic bond in the connection portion. Incidentally, the term "connection of the short time" means that if the connecting bump 30 is a solder bump, the time period during which the connecting bump 30 is heated at 230° C. or higher in the connection forming time (main press-bonding time) is 5 seconds or shorter. The connection time may be 4 seconds or shorter, or 3 seconds or shorter. The productivity tends to be more improved as the connection time is short.

The heating treatment is not limited in particular as long as the heating treatment can apply a temperature equal to or higher than a melting point of a metal of the connecting bumps 30 of the sealed temporarily connected body, and can be performed by a thermocompression bonding machine, a reflow furnace, a pressure oven or the like. The thermocompression bonding machine can locally apply heat, and accordingly a decrease of warpage can be expected. Because of the above reason, from the viewpoint of the decrease of the warpage, it is acceptable to use the thermocompression bonding machine. On the other hand, from the viewpoint of the improvement of the productivity, it is acceptable to use the reflow furnace or the pressure oven which can subject many packages to the heating treatment at one time.

In the first step (temporary press-bonding), it is acceptable to press-bond a plurality of semiconductor chips 10. In this case, it is also acceptable, for example, to temporarily press-bond a plurality of semiconductor chips 10 one by one on a wafer, an interposer or a map substrate in a planar way (first step), and then collectively seal the plurality of chips (second step).

In addition, in the stack press-bonding which is often seen in a package having a TSV structure, a plurality of semiconductor chips 10 are sterically press-bonded. In this case as well, it is acceptable to stack and press-bond the plurality of semiconductor chips 10 one by one (first step), and then seal a plurality of chips (second step).

A method for manufacturing a semiconductor device according to a second embodiment is the method for manufacturing a semiconductor device comprising a semiconductor chip having a connection portion and a wiring circuit board having a connection portion, the respective connection portions being electrically connected to each other, or a semiconductor device comprising a plurality of semiconductor chips having connection portions, the respective connection portions being electrically connected to each other, wherein the connection portions consist of metal, the method comprising:

(a) a first step of press-bonding the semiconductor chip and the wiring circuit board or the semiconductor chips to each other so that the respective connection portions are in contact with each other with a semiconductor adhesive interposed therebetween, at a temperature lower than a melting point of the metal of the connection portion, to obtain a temporarily connected body;

(b) a second step of sealing at least a part of the temporarily connected body with a sealing resin to obtain a sealed temporarily connected body; and (c) a third step of heating the sealed temporarily connected body at a temperature equal to or higher than the melting point of the metal of the connection portion, to obtain a sealed connected body.

Thereby, it is possible to obtain a semiconductor device, for example, shown in FIG. 1(b) or FIG. 2(b).

The second embodiment is similar to the first embodiment, except that the connection portions are connected to each other without through the connecting bump 30.

<Semiconductor Adhesive>

The semiconductor adhesive may contain various components including a compound having a weight average molecular weight of 10000 or less, and a curing agent, as will be described below.

(Compound Having Weight Average Molecular Weight of 10000 or Less)

A compound having a weight average molecular weight of 10000 or less is not limited in particular, but is a compound which reacts with the curing agent contained together. A component having a weight average molecular weight as small as 10000 or less can be decomposed when having been heated and can become a cause of a void, but it is easy to secure high heat resistance by reacting with the curing agent. Examples of such a compound include an epoxy resin and a (meth)acrylic compound.

(i) Epoxy Resin

The epoxy resin is not limited in particular as long as the epoxy resin has two or more epoxy groups in the molecule. Examples of usable epoxy resins are bisphenol A type, bisphenol F type, naphthalene type, phenol novolak type, cresol novolak type, phenol aralkyl type, biphenyl type, triphenylmethane type, dicyclopentadiene type, various multifunctional epoxy resins and the like. These epoxy resins can be used alone or in a form of a mixture of two or more types. From the viewpoints of heat resistance and handling properties, it is acceptable to select from among a bisphenol F type, a phenol novolak type, a cresol novolak type, a biphenyl type and a triphenylmethane type. The amount of the epoxy resin to be blended can be set, for example, at 10 to 50 parts by mass with respect to 100 parts by mass of the total of the semiconductor adhesive. When the amount is 10 parts by mass or more, the curing component sufficiently exists, and accordingly it is easy to sufficiently control the flow of the resin even after curing; and when the amount is 50 parts by mass or less, the cured product does not become too hard and there is a tendency that the epoxy resin in the amount can further suppress the warpage of the package.

(ii) (Meth)Acrylic Compound

A (meth)acrylic compound is not limited in particular as long as the (meth)acrylic compound has one or more (meth)acryloyl groups in the molecule. Examples of usable (meth)acrylic compounds are bisphenol A type, bisphenol F type, naphthalene type, phenol novolak type, cresol novolak type, phenol aralkyl type, biphenyl type, triphenylmethane type, dicyclopentadiene type, fluorene type, adamantane type, and various polyfunctional acrylic compounds and the like. These (meth)acrylic compounds can be used alone or in a form of a mixture of two or more types. The amount of the (meth)acrylic compound to be blended may be 10 to 50 parts by mass, or 15 to 40 parts by mass, with respect to 100 parts by mass of the total of the semiconductor adhesive. When the amount is 10 parts by mass or more, the curing component sufficiently exists, which accordingly makes it easy to sufficiently control the flow of the resin also after curing. When the amount is 50 parts by mass or less, the cured product does not become too hard, which can further suppress the warpage of the package.

The (meth)acrylic compound may be solid at room temperature (25° C.). The solid resists generating voids as compared to a liquid state; and in addition, the viscosity (tack) of the semiconductor adhesive before curing (B stage) is small, resulting in excellent handling properties.

The number of functional groups of the (meth)acrylic compound may be 3 or less. When the number of functional groups is 3 or less, curing sufficiently progresses within a short time, which makes it easier to suppress a drop of the curing reaction rate (though there is a case where network of curing rapidly progresses and unreacted groups may remain), and accordingly cured product characteristics are more easily improved.

A weight average molecular weight of the compound having a weight average molecular weight of 10000 or less may be 100 to 9000, or 300 to 7000, from the viewpoints of the heat resistance and the flowability. A method for measuring the weight average molecular weight is similar to the method for measuring the weight average molecular weight of the high molecular weight component having a weight average molecular weight of more than 10000, which will be described later.

(Curing Agent)

Examples of the curing agent include a phenol resin-based curing agent, an acid anhydride-based curing agent, an amine-based curing agent, an imidazole-based curing agent, a phosphine-based curing agent, azo compounds and organic peroxides.

(i) Phenol Resin-Based Curing Agent

The phenol resin-based curing agent is not limited in particular as long as the phenol resin-based curing agent has two or more phenolic hydroxyl groups in the molecule. Examples of usable phenol resin-based curing agents are a phenol novolak resin, a cresol novolak resin, a phenol aralkyl resin, a cresol naphthol formaldehyde polycondensate, triphenylmethane-based polyfunctional phenol and various multifunctional phenol resins. These phenol resin-based curing agents can be used alone or in a form of a mixture of two or more.

An equivalent ratio (phenolic hydroxyl group/epoxy group, molar ratio) of the phenol resin-based curing agent to the above described epoxy resin is preferably 0.3 to 1.5, 0.4 to 1.0, or 0.5 to 1.0, from the viewpoints of adequate curability, adhesiveness and preservation stability. When the equivalent ratio is 0.3 or more, there is a tendency that the curability is improved and the adhesive force is further improved, and when the equivalent ratio is 1.5 or less, there is a tendency that an unreacted phenolic hydroxyl group does not excessively remain, the water absorption is suppressed to be low, and insulation reliability is more improved.

(ii) Acid Anhydride-Based Curing Agent

Examples of usable acid anhydride-based curing agents are methylcyclohexane tetracarboxylic dianhydride, trimellitic anhydride, pyromellitic anhydride, benzophenone tetracarboxylic dianhydride and ethylene glycol bisanhydrotrimellitate. These acid anhydride-based curing agents can be used alone or in a form of a mixture of two or more types.

The equivalent ratio (acid anhydride group/epoxy group, molar ratio) of the acid anhydride-based curing agent to the above described epoxy resin may be 0.3 to 1.5, 0.4 to 1.0, or 0.5 to 1.0, from the viewpoints of the adequate curability, adhesiveness and preservation stability. When the equivalent ratio is 0.3 or more, there is a tendency that the curability is improved and the adhesive force is further improved, and when the equivalent ratio is 1.5 or less, there is a tendency that an unreacted acid anhydride does not excessively remain, the water absorption is suppressed to be low, and the insulation reliability is more improved.

(iii) Amine-Based Curing Agent

An example of a usable amine-based curing agent is dicyandiamide.

An equivalent ratio (amine/epoxy group, molar ratio) of the amine-based curing agent to the above described epoxy resin may be 0.3 to 1.5, 0.4 to 1.0, or 0.5 to 1.0, from the viewpoints of the adequate curability, adhesiveness and preservation stability. When the equivalent ratio is 0.3 or more, there is a tendency that the curability is improved and the adhesive force is further improved, and when the equivalent ratio is 1.5 or less, there is a tendency that an unreacted amine does not excessively remain, and the insulation reliability is more improved.

(iv) Imidazole-Based Curing Agent

Examples of the imidazole-based curing agents include 2-phenylimidazole, 2-phenyl-4-methylimidazole, 1-benzyl-2-methylimidazole, 1-benzyl-2-phenylimidazole, 1-cyanoethyl-2-undecylimidazole, 1-cyano-2-phenylimidazole, 1-cyanoethyl-2-undecylimidazole trimellitate, 1-cyanoethyl-2-phenylimidazolium trimellitate, 2,4-diamino-6-[2'-methylimidazolyl-(1')]-ethyl-s-triazine, 2,4-diamino-6-[2'-undecylimidazolyl-(1')]-ethyl-s-triazine, 2,4-diamino-6-[2'-ethyl-4'-methylimidazolyl-(1')]-ethyl-s-triazine, 2,4-diamino-6-[2'-methylimidazolyl-(1')]-ethyl-s-triazine isocyanuric acid adduct, 2-phenylimidazole isocyanuric acid adduct, 2-phenyl-4,5-dihydroxymethylimidazole, 2-phenyl-4-methyl-5-hydroxymethylimidazole, and adducts of the epoxy resin and imidazoles. Among the above imidazole-based curing agents, from the viewpoints of excellent curability, preservation stability and connection reliability, it is acceptable to select from 1-cyanoethyl-2-undecylimidazole, 1-cyano-2-phenylimidazole, 1-cyanoethyl-2-undecylimidazole trimellitate, 1-cyanoethyl-2-phenylimidazolium trimellitate, 2,4-diamino-6-[2'-methylimidazolyl-(1')]-ethyl-s-triazine, 2,4-diamino-6-[2'-ethyl-4'-methylimidazolyl-(1')]-ethyl-s-triazine, 2,4-diamino-6-[2'-methylimidazolyl-(1')]-ethyl-s-triazine isocyanuric acid adduct, 2-phenylimidazole isocyanuric acid adduct, 2-phenyl-4,5-dihydroxymethylimidazole and 2-phenyl-4-methyl-5-hydroxymethylimidazole. These imidazole-based curing agents may be used alone or in combination of two or more types. In addition, it is also acceptable to microencapsulate the imidazole-based curing agent to form a latent curing agent.

The content of the imidazole-based curing agent may be 0.1 to 20 parts by mass, or 0.1 to 10 parts by mass with respect to 100 parts by mass of the epoxy resin. When the content of the imidazole-based curing agent is 0.1 parts by mass or more, there is a tendency that the curability is improved, and when the content is 20 parts by mass or less, the semiconductor adhesive resists being cured before the metallic bond is formed, and accordingly there is a tendency that a connection failure is hard to occur.

(v) Phosphine-Based Curing Agent

Examples of the phosphine-based curing agent include triphenylphosphine, tetraphenylphosphonium tetraphenylborate, tetraphenylphosphonium tetra(4-methylphenyl)borate, and tetraphenylphosphonium (4-fluorophenyl)borate.

The content of the phosphine-based curing agent may be 0.1 to 10 parts by mass, or 0.1 to 5 parts by mass with respect to 100 parts by mass of the epoxy resin. When the content of the phosphine-based curing agent is 0.1 parts by mass or more, there is a tendency that the curability is improved, and when the content is 10 parts by mass or less, the semiconductor adhesive resists being cured before the metallic bond is formed, and accordingly there is a tendency that the connection failure is hard to occur.

The phenol resin-based curing agent, the acid anhydride-based curing agent and the amine-based curing agent can be used alone or in a form of a mixture of two or more types, respectively. The imidazole-based curing agent and the phosphine-based curing agent may be each used alone or in combination with the phenol resin-based curing agent, the acid anhydride-based curing agent or the amine-based curing agent.

(vi) Organic Peroxide

Examples of organic peroxides include ketone peroxide, peroxy ketals, hydroperoxides, dialkyl peroxides, diacyl peroxides, peroxy dicarbonates and peroxy esters. From the viewpoint of the preservation stability, it is acceptable to select from the hydroperoxides, the dialkyl peroxides and the peroxy esters. Furthermore, from the viewpoint of the heat resistance, it is acceptable to select from the hydroperoxides and the dialkyl peroxides.

The content of the organic peroxides may be 0.5 to 10 wt %, or 1 to 5 wt % with respect to the total weight of the (meth)acrylic compound. When the content is 0.5 wt % or more, the curing tends to sufficiently progress; and when the content is 10 wt % or less, since curing rapidly progresses to increase the number of reactive sites, a decrease in reliability caused by shortening of a molecule chain or remaining of unreacted groups is less likely to occur.

The above described organic peroxides can be used alone or in a form of a mixture of two or more types.

The combination of the epoxy resin and the (meth)acrylic compound with the curing agents (i) to (vi) is not limited in particular, as long as the curing progresses. The curing agent which is combined with the epoxy resin may be selected from phenol and imidazole, acid anhydride and imidazole, amine and imidazole, or imidazole alone, from the viewpoints of the handling properties, the preservation stability and the curability. Since productivity improves when the connection portions are connected to each other in a short time, the imidazole may be used alone which is excellent in quick curability. Since volatile components such as low molecular weight components can be suppressed when the adhesive is cured in a short time, the void generation can also be suppressed. A curing agent which is combined with the (meth)acrylic compound may be the organic peroxides, from the viewpoints of the handling properties and the preservation stability.

The curing reaction rate may be 80% or more, or 90% or more. When the curing reaction rate at 200° C. (equal to or lower than solder melting temperature)/5 s is 80% or more, the solder resists causing flowing/scattering at the time of connection (at temperature equal to or higher than solder melting temperature), and there is a tendency that the connection failure and an insulation reliability failure are hard to occur.

The curing system may be a radical polymerization system. For example, a (meth)acrylic compound of radical polymerization (curing system of acrylic-peroxide) is preferable as the compound having a weight average molecular weight of 10000 or less, in comparison with an epoxy resin of anionic polymerization (curing system of epoxy—curing agent). The acrylic curing system shows higher curing reaction rate, and accordingly more easily suppresses the void, and more easily suppresses the flowing/scattering of a metal of the connection portion. When containing the epoxy resin of anionic polymerization or the like, there is a case where it is difficult that the curing reaction rate becomes 80% or more. When the epoxy resin is used together, the epoxy resin may be 20 parts by mass or less with respect to 80 parts by mass of the (meth)acrylic compound. The acrylic curing system may be used alone.

(Silanol Compound)

The silanol compound is represented by the following general formula (1).

[Chemical Formula 2]

$$R^1-R^2-Si(OH)_3 \qquad (1)$$

wherein $R^1$ represents an alkyl group or a phenyl group, and $R^2$ represents an alkylene group.

The silanol compound may be solid at 25° C., from the viewpoint of the heat resistance. $R^1$ may be an alkyl group or a phenyl group, from the viewpoints of the heat resistance and the flowability. $R^1$ may be a mixture of the alkyl group and the phenyl group. Examples of a group represented by $R^1$ include a phenyl-based group, a propyl-based group, a phenylpropyl-based group and a phenylmethyl-based group. $R^2$ is not limited in particular. From the viewpoint of the heat resistance, $R^2$ may be an alkylene group having a weight average molecular weight of 100 to 5000. From the viewpoint of high reactivity (strength of cured product), the silanol compound may be a trifunctional silanol.

By adding the silanol compound to the semiconductor adhesive, the flowability is improved, and void suppressive properties and high connectivity are improved. When the flowability is improved (viscosity decreases), it becomes easy to eliminate entangled voids at the time of chip contact. Void generation can be further suppressed by using a silanol compound having a high heat resistance (having a small amount of thermal weight reduction). When the amount of thermal weight reduction is small, the amount of volatile components is small and accordingly voids are reduced; and also reliability (reflow resistance) is further improved.

The content of the silanol compound may be 2 to 20 mass % on a base of the total amount of the semiconductor adhesive, and from the viewpoints of high fluidization and a strength of the cured product (adhesive force or the like), 2 to 10 mass % or 2 to 9 mass %. When the content is 2 mass % or more, the effect (high fluidization) tends to appear, and when the content is 20% by mass or less, the curing strength increases, and the high adhesive force tends to appear. It is assumed that when the content is small to some extent, a ratio of the cured product of the epoxy resin or the acrylic resin increases, and accordingly a higher adhesive force is developed.

(High Molecular Weight Component Having Weight Average Molecular Weight of More than 10000)

Examples of a high molecular weight component having a weight average molecular weight of more than 10000 include an epoxy resin, a phenoxy resin, a polyimide resin, a polyamide resin, a polycarbodiimide resin, a cyanate ester resin, an acrylic resin, a polyester resin, a polyethylene resin, a polyethersulfone resin, a polyetherimide resin, a polyvinyl acetal resin, a urethane resin and an acrylic rubber. It is also acceptable to select from among the epoxy resin, the phenoxy resin, the polyimide resin, the acrylic resin, the acrylic rubber, the cyanate ester resin, the polycarbodiimide resin and the like, which are excellent in heat resistance and film formability in the above components. Furthermore, it is also acceptable to select from among the epoxy resin, the phenoxy resin, the polyimide resin, the acrylic resin, and the acrylic rubber, which are further excellent in the heat resistance and film formability. These high molecular weight components can be used alone, or in a form of a mixture or a copolymer of two or more types.

When the semiconductor adhesive contains the epoxy resin, the weight ratio of the high molecular weight component having a weight average molecular weight of more than 10000 to the epoxy resin is not limited in particular. The epoxy resin may be 0.01 to 5 parts by weight, 0.05 to 4 parts by weight or 0.1 to 3 parts by weight with respect to 1 part by weight of the high molecular weight component having a weight average molecular weight of more than 10000, from the viewpoint that the film form is easily retained. When the weight ratio is 0.01 parts by weight or more, there is a tendency that the curability is improved and the adhesive force is further improved. When the weight ratio is 5 parts by weight or less, there is a tendency that the film formability and the membrane formability are particularly excellent.

When the semiconductor adhesive contains a (meth) acrylic compound, the weight ratio of the high molecular weight component having a weight average molecular weight of more than 10000 to the (meth)acrylic compound is not limited in particular. The (meth)acrylic compound may be 0.01 to 10 parts by weight, 0.05 to 5 parts by weight, or 0.1 to 5 parts by weight with respect to 1 part by weight of the high molecular weight component having a weight average molecular weight of more than 10000. When the weight ratio is 0.01 parts by weight or more, there is a tendency that the curability is improved and the adhesive force is further improved. When the weight ratio is larger than 10 parts by weight, there is a tendency that the film formability is particularly excellent.

The glass transition temperature (Tg) of the high molecular weight component having a weight average molecular weight of more than 10000 may be 120° C. or lower, 100° C. or lower, or 85° C. or lower, from the viewpoint of being excellent in sticking properties of the semiconductor adhesive to the substrate and the chip. When the Tg is 120° C. or lower, it becomes easy to embed the adhesive composition in unevenness such as bumps which are formed on the semiconductor chip, and the electrode or the wiring pattern which is formed on the substrate, and accordingly there is a tendency that the air bubbles resist remaining and voids resist being generated. Incidentally, the above described Tg is a Tg at the time when having been measured with the use of DSC (DSC-7 model made by Perkin Elmer Corp.) under conditions that the amount of the sample is 10 mg, a rate of temperature increase is 10° C./min, and a measuring atmosphere is air.

The weight average molecular weight of the high molecular weight component having a weight average molecular weight of more than 10000 is more than 10000 in terms of polystyrene, but may be 30000 or more, 40000 or more, or 50000 or more, in order that the high molecular weight component by itself exhibits more adequate film formability. When the weight average molecular weight is more than 10000, there is a tendency that the film formability is particularly excellent. Incidentally, in the present specification, the weight average molecular weight means a weight average molecular weight at the time when the weight average molecular weight has been measured in terms of polystyrene, with the use of high performance liquid chromatography (C-R4A made by Shimadzu Corporation).

The semiconductor adhesive can contain a flux component, specifically, a flux activator that is a compound which exhibits flux activity (activity to eliminate oxides and impurities). Examples of the flux activator include: a nitrogen-containing compound which has an unshared electron pair, such as imidazoles and amines; carboxylic acids; phenols; and alcohols. Organic acids have a tendency to more strongly express the flux activity, and further improve the connectivity, as compared to alcohols and the like. The carboxylic acids can further improve the connectivity and the stability.

The semiconductor adhesive may be blended with a filler, in order to control the viscosity and the physical properties of the cured product, and to suppress an occurrence of voids at the time when the semiconductor chips or the semiconductor chip and the substrate are connected to each other, and suppress the moisture absorption rate. Examples of the insulating inorganic filler include glass, silica, alumina, titanium oxide, carbon black, mica and boron nitride; from the viewpoint of handling properties, silica, alumina, titanium oxide, boron nitride and the like may be selected out of the above materials; and from the viewpoint of shape uniformity (handling properties), silica, alumina and boron nitride may be selected. Examples of a whisker include aluminum borate, aluminum titanate, zinc oxide, calcium silicate, magnesium sulfate and boron nitride. Usable resin fillers are polyurethane, polyimide, a methyl methacrylate resin, a methyl methacrylate-butadiene-styrene copolymer resin (MBS) and the like. These fillers and whiskers may be used alone or in a form of a mixture of two or more types. The shape, particle size and amount of the filler to be blended are not limited in particular.

A surface-treated filler is also acceptable from the viewpoints of improvements of dispersibility and the adhesive force. Examples of the surface treatment include a glycidyl (epoxy) base, an amine base, a phenyl base, a phenylamino base, an acrylic base, and a vinyl base.

These fillers and whiskers may be used alone or in a form of a mixture of two or more types. The shape, particle size and amount of the filler to be blended are not limited in particular. In addition, physical properties may be appropriately adjusted by surface treatment.

As for the particle size, the average particle size may be 1.5 μm or less, from the viewpoint of preventing the filler from being trapped at the time of flip chip connection, and the average particle size may be 1.0 μm or less, from the viewpoint of visibility (transparency).

The surface treatment may be silane treatment by a silane compound such as an epoxysilane base, an aminosilane base, and an acrylic silane base, in view of ease of the surface treatment.

The surface treatment agent may be a compound which is selected from compounds of a glycidyl base, a phenylamino base, an acrylic base and a methacrylic base, from the viewpoints of being excellent in the dispersibility and the flowability and further improving the adhesive force. The surface treatment agent may be the compound which is selected from a phenyl base, the acrylic base and the methacrylic base, from the viewpoint of the preservation stability.

The resin filler can impart flexibility at a high temperature such as 260° C., as compared to the inorganic filler, and accordingly is suitable for improving the reflow resistance. In addition, because of imparting the flexibility, the resin filler is effective also for improving the film formability.

The filler may be insulative, from the viewpoint of insulation reliability. A semiconductor adhesive is also acceptable which does not contain an electro-conductive metallic filler such as a silver filler or a solder filler.

The amount of the filler to be blended may be 30 to 90% by mass, or 40 to 80% by mass, on a base of the whole solid content of the semiconductor adhesive. When the amount blended is 30% by mass or more, the heat dissipation properties tend to become easily high, and there is a tendency to further suppress the void generation and the moisture absorption rate. When the content is 90% by mass or less, it is easy to suppress the occurrence that the flowability of the adhesive composition decreases and the filler is trapped (trapping) in the connection portion, as a result that the viscosity becomes high, and accordingly there is a tendency that the connection reliability is further improved.

Furthermore, the semiconductor adhesive may be blended with an ion trapper, an antioxidant, a silane coupling agent, a titanium coupling agent, a leveling agent and the like. As for these agents, one type may be used alone, or may be used in combination with other one or more types. Amounts of these agents to be blended may be appropriately adjusted so that the effect of each additive appears.

The semiconductor adhesive can be press-bonded at high temperatures of 200° C. or higher. In addition, in a flip chip package of forming the connection by melting a metal such as a solder, the semiconductor adhesive further expresses the effect.

The semiconductor adhesive may be in the film form. When in the film form, there is a tendency that the productivity improves.

One example of a method for preparing a semiconductor adhesive (film form) is as follows. A resin varnish is prepared by adding a high molecular weight component having a weight average molecular weight of more than 10000, a compound having a weight average molecular weight of 10000 or less, a curing agent, a filler, other additives and the like into an organic solvent, and dissolving or dispersing the materials in the solvent by stirring and mixing, kneading or the like. After the preparation, the resin varnish is applied onto a base film which has been subjected to a releasing treatment, with the use of a knife coater, a roll coater, an applicator, a die coater, a comma coater or the like, then the organic solvent is reduced by heating, and a film-form adhesive is formed on the base film. In addition, it is acceptable to form the semiconductor adhesive on a wafer, by a method of forming a film by spin coating the resin varnish on the wafer or the like before the organic solvent is reduced by heating, and then drying the solvent.

The base film is not limited in particular as long as the base film has such a level of heat resistance as to be capable of withstanding the heating conditions at the time when the organic solvent is volatilized. Examples of the base film include a polyester film, a polypropylene film, a polyethylene terephthalate film, a polyimide film, a polyetherimide film, a polyether naphthalate film and a methylpentene film. The base film is not limited to a single layer consisting of the above films, but may be a multilayer film consisting of two or more types of the materials.

The conditions for volatilizing the organic solvent from the resin varnish after having been applied may be, for example, to heat the resin varnish at 50 to 200° C. for 0.1 to 90 minutes. If there is no influence on void and viscosity adjustment after mounting, such a condition is also acceptable that the organic solvent volatilizes to 1.5% by mass or less.

As for the semiconductor adhesive, melt viscosity at the time of the first step (temporary press-bonding) of press-bonding at a temperature (80 to 130° C.) lower than a melting point of the connecting bump 30 or the bump 32 may be 6000 Pa·s or less, 5500 Pa·s or less, 5000 Pa·s or less, or 4000 Pa·s or less, so as to enhance the flowability and be capable of eliminating more entangled voids. However, if the melt viscosity is too low, there is a tendency that the resin creeps up the side surface of the chip, adheres to the press-bonding tool, and lowers the productivity. Because of the above reason, the melt viscosity at the time of the temporary press-bonding may be 1000 Pa·s or more. The melt viscosity can be measured, for example, with the use of a rheometer (MCR 301, made by Anton Paar Japan K.K.).

<Sealing Resin>

The sealing resin is not limited in particular as long as the resin is a resin which is used for sealing a semiconductor device. Examples of such resins include a bisphenol A type epoxy resin, a bisphenol F type epoxy resin, a bisphenol AD type epoxy resin, a bisphenol S type epoxy resin, a naphthalenediol type epoxy resin, a hydrogenated bisphenol A type epoxy resin and a glycidyl amine type epoxy resin.

EXAMPLES

Hereinafter, the present invention will be described with reference to examples, but the present invention is not limited by these examples.

<Preparation of Film-Form Adhesive>

The used compounds are shown below.

(i) High molecular weight component having weight average molecular weight of more than 10000

Acrylic rubber (KH-C 865, made by Hitachi Chemical Company, Ltd., Tg: 0 to 12° C., and Mw: 450000 to 650000)

Phenoxy resin (ZX-1356-2, made by Tohto Kasei Co., Ltd., Tg: approximately 71° C., Mw: approximately 63000)

(ii) Compound having weight average molecular weight of 10000 or less: (meth)acrylic compound Fluorene skeleton acrylate (EA0200, made by Osaka Gas Chemicals Co., Ltd., two functional groups)

(iii) Compound having weight average molecular weight of 10000 or less: epoxy resin Triphenolmethane skeleton-containing polyfunctional solid epoxy (EP1032H60, made by Mitsubishi Chemical Corporation) Bisphenol F type liquid epoxy (YL983U, made by Mitsubishi Chemical Corporation)

(iv) Curing Agent

Dicumyl peroxide (Percumyl D, made by NOF CORPORATION)

2,4-Diamine-6[2'-methylimidazolyl-(1')-ethyl-s-triazine isocyanuric acid adduct (2MAOK-PW, made by Shikoku Chemicals Corporation)

(v) Inorganic Filler

Silica filler (SE 2050, made by Admatechs, average particle size of 0.5 μm)

Epoxysilane surface-treated silica filler (SE2050SEJ, made by Admatechs, average particle size of 0.5 μm)

Methacrylic surface-treated nano-silica filler (YA050C-SM, made by Admatechs, hereinafter referred to as SM nano-silica, average particle size of approximately 50 nm)

(vi) Resin Filler

Organic filler (EXL-2655: core-shell type organic fine particle, made by Rohm and Haas Japan)

(vii) Fluxing Agent

2-Methylglutaric acid (made by Aldrich, melting point: approximately 77° C.)

(Method for Preparing Film-Form Adhesive)

An organic solvent (methyl ethyl ketone) was added to a (meth)acrylic compound or an epoxy resin, an inorganic filler, a resin filler and a fluxing agent, of which the mass ratios are shown in Table 1, so that NV became 60% (so that all of components constituting adhesive such as liquid component, solid component and filler became 60 mass % with respect to 40 mass % of solvent). After the addition, beads with Φ 1.0 mm and Φ 2.0 mm of the same weight as the solid content were added, and the resultant mixture was stirred for 30 minutes with a bead mill (made by Fritsch Japan Co., Ltd, planetary pulverizer P-7). After the stirring, the high molecular weight component was added, and the resultant mixture was stirred with a bead mill for 30 minutes again. After the stirring, a curing agent was added, the resultant mixture was stirred, then the used beads were removed by filtration, and two types of resin varnishes were obtained.

Each of the prepared resin varnishes was coated on a base film of which the surface was subjected to a releasing treatment by a small precision coating apparatus (made by Yasui Seiki Inc.), the coated resin varnish was dried (70° C./10 min) in a clean oven (made by ESPEC CORP.), and two types of film-form adhesives A and B were obtained.

TABLE 1

|  | Amount blended (parts by mass) | Film-form adhesive A | Film-form adhesive B |
|---|---|---|---|
| High molecular weight component | KH-C865 | 30 | — |
|  | ZX-1356-2 | — | 30 |
| (Meth)acrylic compound | EA0200 | 60 | — |
| Epoxy resin | EP1032H60 | — | 45 |
|  | YL983U | — | 15 |
| Curing agent | Percumyl D | 2 | — |
|  | 2MAOK-PW | — | 6 |
| Inorganic filler | SE2050 | 15 | 15 |
|  | SE2050SEJ | 15 | 15 |
|  | SM nano-silica | 85 | 45 |
| Resin filler | EXL-2655 | 10 | 10 |
| Fluxing agent | 2-Methylglutaric acid | — | 4 |

<Manufacture of Semiconductor Device>

Example 1

Step 1: the film-form adhesive which was prepared in the above description was cut out (8 mm×8 mm×0.045 mm$^r$), and was stuck onto a substrate (20 mm×27 mm, 0.41 mm thick, metal of connection portion: Cu (OSP treatment), and product name: HCTEG-P1180-02, made by Hitachi Chemical Electronics Co., Ltd.). Onto the adhesive, a semiconductor chip provided with solder bumps (chip size: 7.3 mm×7.3 mm×0.15 mm$^r$, bump height: approximately 45 μm in total of copper pillar+solder, number of bumps of 328 pins, pitch of 80 μm, and product name: SM487A-HC-PLT, made by Sumitomo Corporation Kyushu Co., Ltd.) was temporarily press-bonded with the use of a thermocompression bonding machine (FCB 3, made by Panasonic Corporation) on conditions that a stage temperature was 80° C., a temporary press-bonding temperature was 130° C. and a temporary press-bonding time was 2 seconds.

Step 2: the upper surface of the chip of the temporarily press-bonded semiconductor package (temporarily connected body) was sealed with the use of a mold device (made by Techno Marushichi Co., Ltd.), and a sealed body (sealed temporarily connected body) was formed.

Step 3: the obtained sealed body was subjected to heating treatment with the use of the above described thermocompression bonding machine (FCB 3, made by Panasonic Corporation) at a stage temperature of 80° C. and a press-bonding temperature of 280° C., and a semiconductor device (sealed connected body) was prepared.

Other Examples

A semiconductor device was manufactured in a similar way to that in Example 1, except that as shown in Table 2, the heating treatment was performed with the use of a thermocompression bonding machine (FCB 3, made by Panasonic Corporation) or a reflow device (made by Tamura Corporation), the film-form adhesive A or B was used as the film-form adhesive, and the temporary press-bonding temperature was set at 130° C. (in the case where film-form adhesive A was used) or 80° C. (in the case where film-form adhesive B was used).

Comparative Example

A semiconductor device was manufactured in a similar way to that in Example 1, except that as shown in Table 2, the heating treatment was performed with the use of a thermocompression bonding machine (FCB 3, made by Panasonic Corporation) or a reflow device (made by Tamura Corporation), the film-form adhesive A or B was used as the film-form adhesive, the step 2 and the step 3 were interchanged, and the temporary press-bonding temperature was set at 130° C. (in the case where film-form adhesive A was used) or 80° C. (in the case where film-form adhesive B was used). Incidentally, an operation of having interchanged the step 2 with the step 3 means that the sealing treatment was performed with the use of the molding apparatus, after the connection between the substrate and the semiconductor chip was completed.

<Evaluation>

Evaluation of Melt Viscosity

The melt viscosity of the film-form adhesive in the step 1 (temporary press-bonding temperature: 80 to 130° C.), which was prepared in the above description, was measured with the use of a rheometer (made by Anton Paar Japan K.K., MCR 301) and a jig (disposable plate (diameter: 8 mm) and disposable sample dish), under conditions that a thickness of the sample was 400 μm, a rate of temperature increase was 10° C./min, and a frequency was 1 Hz. The results are shown in Table 2.

Evaluation of Warpage

Shapes of two sides in the diagonal direction of the chip in each of the semiconductor devices which were prepared in the above description were measured with the use of a non-contact type shape measuring apparatus (made by Sony Corporation). The inclination of the measurement data was collected with the use of EXCEL, and a difference between the maximum value and the minimum value of the unevenness of one side was determined to be the amount (μm) of the warpage. The results are shown in Table 2.

nected to each other, or a semiconductor device comprising a plurality of semiconductor chips having connection portions, the respective connection portions being electrically connected to each other, wherein the connection portions consist of metal, the method comprising:

(a) a first step of press-bonding the semiconductor chip and the wiring circuit board or the semiconductor chips to each other so that the respective connection portions are in contact with each other with a semiconductor adhesive interposed therebetween, at a temperature lower than a melting point of the metal of the connection portion, to obtain a temporarily connected body;

(b) a second step of sealing at least a part of the temporarily connected body with a sealing resin to obtain a sealed temporarily connected body; and (c) a third step of heating the sealed temporarily connected body at a temperature equal to or higher than the melting point of the metal of the connection portion, to obtain a sealed connected body.

2. A method for manufacturing a semiconductor device comprising a semiconductor chip having a connection portion and a wiring circuit board having a connection portion, the respective connection portions being electrically connected to each other through a connecting bump, or a semiconductor device comprising a plurality of semiconductor chips having connection portions, the respective connection portions being electrically connected to each other through a connecting bump, wherein the connection portions and the connecting bump consist of metal, the method comprising:

(a) a first step of press-bonding the semiconductor chip and the wiring circuit board or the semiconductor chips

TABLE 2

| | | Example 1 | Example 2 | Example 3 | Example 4 | Comparative Example 1 | Comparative Example 2 | Comparative Example 3 | Comparative Example 4 |
|---|---|---|---|---|---|---|---|---|---|
| Step | 1 | Temporary press-bonding | Temporary press-bonding | Temporary press-bonding | Temporary press-bonding | Temporary press-bonding | Temporary press-bonding | Temporary press-bonding | Temporary press-bonding |
| | 2 | Mold | Mold | Mold | Mold | Thermo-compression bonding | Thermo-compression bonding | Reflow | Reflow |
| | 3 | Thermo-compression bonding | Thermo-compression bonding | Reflow | Reflow | Mold | Mold | Mold | Mold |
| Film-form adhesive | Type | A | B | A | B | A | B | A | B |
| | Viscosity (Pa · s) | 4830 | 5020 | 4830 | 5020 | 4830 | 5020 | 4830 | 5020 |
| Amount of warpage (μm) | | 61.9 | 60.4 | 71.5 | 70.3 | 81 | 75.6 | 86.4 | 81.8 |

REFERENCE SIGNS LIST

10 . . . semiconductor chip, 12 . . . semiconductor chip body, 15 . . . wire (connection portion), 20 . . . substrate (wiring circuit board), 22 . . . substrate body, 30 . . . connecting bump, 32 . . . bump (connection portion), 34 . . . through electrode, 40 . . . adhesive layer, 50 . . . interposer, 60 . . . sealing resin, 100, 200, 300, 400, 500, 600 and 700 . . . semiconductor device.

The invention claimed is:

1. A method for manufacturing a semiconductor device comprising a semiconductor chip having a connection portion and a wiring circuit board having a connection portion, the respective connection portions being electrically conto each other so that the respective connection portions are in contact with the connecting bump with a semiconductor adhesive interposed therebetween, at a temperature lower than a melting point of the metal of the connecting bump, to obtain a temporarily connected body;

(b) a second step of sealing at least a part of the temporarily connected body with a sealing resin to obtain a sealed temporarily connected body; and (c) a third step of heating the sealed temporarily connected body at a temperature equal to or higher than the melting point of the metal of the connecting bump, to obtain a sealed connected body.

3. The method for manufacturing a semiconductor device according to claim 1, wherein the first step comprises sandwiching the semiconductor chip and the wiring circuit board or the semiconductor chips with a pair of facing pressing members, and heating and pressurizing, to thereby press-bond the semiconductor chip and the wiring circuit board or the semiconductor chips to each other.

4. The method for manufacturing a semiconductor device according to claim 1, wherein the semiconductor adhesive contains a compound having a weight average molecular weight of 10000 or less and a curing agent, and a melt viscosity at 80 to 130° C. is 6000 Pa·s or less.

5. The method for manufacturing a semiconductor device according to claim 1, wherein the semiconductor adhesive contains a compound having a weight average molecular weight of 10000 or less, a curing agent, and a silanol compound represented by the following general formula (1):

[Chemical Formula 1]

wherein $R^1$ represents an alkyl group or a phenyl group, and $R^2$ represents an alkylene group.

6. The method for manufacturing a semiconductor device according to claim 5, wherein $R^1$ is a phenyl group.

7. The method for manufacturing a semiconductor device according to claim 5, wherein the silanol compound is solid at 25° C.

8. The method for manufacturing a semiconductor device according to claim 1, wherein the semiconductor adhesive contains a high molecular weight component having a weight average molecular weight of more than 10000.

9. The method for manufacturing a semiconductor device according to claim 8, wherein the high molecular weight component is a component having a weight average molecular weight of 30000 or more and a glass transition temperature of 100° C. or lower.

10. The method for manufacturing a semiconductor device according to claim 1, wherein the semiconductor adhesive is in a film form.

11. The method for manufacturing a semiconductor device according to claim 2, wherein the first step comprises sandwiching the semiconductor chip and the wiring circuit board or the semiconductor chips with a pair of facing pressing members, and heating and pressurizing, to thereby press-bond the semiconductor chip and the wiring circuit board or the semiconductor chips to each other.

12. The method for manufacturing a semiconductor device according to claim 2, wherein the semiconductor adhesive contains a compound having a weight average molecular weight of 10000 or less and a curing agent, and a melt viscosity at 80 to 130° C. is 6000 Pa·s or less.

13. The method for manufacturing a semiconductor device according to claim 2, wherein the semiconductor adhesive contains a compound having a weight average molecular weight of 10000 or less, a curing agent, and a silanol compound represented by the following general formula (1):

[Chemical Formula 1]

wherein $R^1$ represents an alkyl group or a phenyl group, and $R^2$ represents an alkylene group.

14. The method for manufacturing a semiconductor device according to claim 13, wherein $R^1$ is a phenyl group.

15. The method for manufacturing a semiconductor device according to claim 13, wherein the silanol compound is solid at 25° C.

16. The method for manufacturing a semiconductor device according to claim 2, wherein the semiconductor adhesive contains a high molecular weight component having a weight average molecular weight of more than 10000.

17. The method for manufacturing a semiconductor device according to claim 16, wherein the high molecular weight component is a component having a weight average molecular weight of 30000 or more and a glass transition temperature of 100° C. or lower.

18. The method for manufacturing a semiconductor device according to claim 2, wherein the semiconductor adhesive is in a film form.

* * * * *